United States Patent
Shimoyama et al.

(10) Patent No.: US 6,556,482 B2
(45) Date of Patent: Apr. 29, 2003

(54) SEMICONDUCTOR MEMORY DEVICE

(75) Inventors: Takato Shimoyama, Tokyo (JP); Hiroyuki Takahashi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/872,291

(22) Filed: Jun. 1, 2001

(65) Prior Publication Data

US 2001/0024382 A1 Sep. 27, 2001

Related U.S. Application Data

(63) Continuation-in-part of application No. 09/602,937, filed on Jun. 23, 2000, now Pat. No. 6,356,473.

(30) Foreign Application Priority Data

Jun. 24, 1999 (JP) .............................. 11-177854
Jun. 2, 2000 (JP) ....................... 2000-166134

(51) Int. Cl.$^7$ .......................... G11C 16/04; G11C 15/00
(52) U.S. Cl. ............... 365/189.01; 365/189.04
(58) Field of Search ................ 365/189.01, 149, 365/154, 49, 189.04, 189.05, 230.01, 230.08

(56) References Cited

U.S. PATENT DOCUMENTS 5,889,728 A * 3/1999 Rezeanu ..................... 365/194
6,067,256 A * 5/2000 Yamashita et al. ...... 365/189.04
6,275,437 B1 * 8/2001 Kim et al. .................. 365/149

FOREIGN PATENT DOCUMENTS

| JP | 59-172194 | 9/1984 |
| JP | 05-074162 | 3/1993 |
| JP | 08-045277 | 2/1996 |
| JP | 10-149682 | 9/1997 |

* cited by examiner

Primary Examiner—Richard Elms
Assistant Examiner—Anh Phung
(74) Attorney, Agent, or Firm—Darryl G. Walker; Bradley T. Sako

(57) ABSTRACT

According to the disclosed embodiments, a semiconductor memory device may include an address register circuit (406) and data register circuit (411) that can store a write address and write data from one write operation and output the stored write address and write data during a subsequent write operation. In a dynamic random access memory (DRAM) embodiment (400), a precharge and/or refresh operation may follow the writing of previously stored write data. Such an arrangement may reduce and/or eliminate a read after write timing requirement (TWR), which can improve the operating speed of the semiconductor memory device.

20 Claims, 11 Drawing Sheets

SEMICONDUCTOR MEMORY DEVICE

This application is a continuation-in-part of patent application Ser. No. 09/602,937 filed Jun. 23, 2000, now U.S. Pat. No. 6,356,473 issued on Mar. 12, 2002.

TECHNICAL FIELD

The present invention relates generally to semiconductor memory devices having a memory circuit, such as a static random access memory (SRAM) or dynamic random access memory (DRAM), and more particularly to approaches for increasing access speeds for such devices.

BACKGROUND OF THE INVENTION

Static random access memory (SRAM) circuits are highly valued in many applications due to their relatively fast access speeds. However, such fast access speeds typically come at the cost of increased current consumption and hence increased power consumption. With the advent of portable electronic devices, it has become an increasingly important goal to manufacture integrated circuits that consume less power. Thus, an increasingly important goal in SRAM circuit design has been to find ways to decrease the current and/or power consumption of such circuits, while maintaining relatively fast operating speeds.

SRAM circuits can typically include a number of SRAM memory cells. One particular type of SRAM memory cell is the six transistor (6-T) memory cell. One example of a 6-T memory cell is shown in FIG. 9a. The 6-T memory cell of FIG. 9a includes a pair of driver transistors Tr1 and Tr2 having cross-coupled gate-drain connections at nodes N1 and N2. Access transistors Tr3 and Tr4 can connect nodes N1 and N2 to digit lines D and /D. A 6-T memory cell may further include a pair of load devices. In some configurations, load devices can include transistors, while in other configurations load devices can include resistors. FIG. 9a illustrates an example of a 6-T memory cell with transistors Tr5 and Tr6 as load devices.

It is noted that while memory cells that include resistors as load devices are often referred to as "4-T" memory cells, to avoid confusion with "true" 4-T memory cells discussed in more depth below, such four transistor, two resistor-type memory cells will also be considered 6-T cells for the purposes of this discussion.

The gates of access transistors Tr3 and Tr4 can be connected to a word line WL. Load devices (Tr5 and Tr6) can be connected between nodes N1 and N2 and a high power supply voltage. Driver transistors (Tr1 and Tr2) can have source-drain paths connected between nodes N1 and N2 and a low power supply voltage.

Another example of a 6-T memory cell is shown in FIG. 9b. The 6-T memory cell of FIG. 9b can include a pair of driver NMOS (n-channel insulated gate field effect transistor (IGFET)) type driver transistors (Tr1 and Tr2) having cross-coupled gate-drain connections at nodes N1 and N2. A pair of NMOS type access transistors (Tr3 and Tr4) can connect nodes N1 and N2 to digit lines D and /D. A 6-T memory cell may further include a pair of PMOS (p-channel IGFET) type load transistors Tr5 and Tr6 having cross-coupled gate-drain connections at nodes N1 and N2. The gates of NMOS type access transistors Tr3 and Tr4 can be connected to a word line WL. PMOS type load transistors Tr5 and Tr6 can be connected between nodes N1 and N2 and a high power supply voltage. NMOS type driver transistors (Tr1 and Tr2) can have source-drain paths connected between nodes N1 and N2 and a low power supply voltage.

SRAM circuits may select memory cells for access (e.g., a read or write operation) in a variety of ways. One type of access is provided by "true" asynchronous SRAM circuits. A true asynchronous SRAM circuit can operate in response to applied input signals, and not in response to an external timing signal, such as a periodic clock signal. In many applications, true asynchronous SRAM circuits timing is based on a transition in an applied address value.

An example of a true asynchronous SRAM circuit operation is shown in FIG. 10. FIG. 10 is a timing diagram showing an address value ADD, a chip select signal /CS, a write enable signal /WE, a data input value DIN, and an indication of selected word line values (SEL WL). In FIG. 10, a chip select signal /CS and write enable signal /WE can be active (low in this case) and the address can make a transition. A data value (DATA) that is to be written can also be entered.

In response to the address transition, a word line WL and digit line pair (D and /D) can be selected. The input data (DATA) may then be written into the memory cell selected by the word line and digit line pair (D and /D).

A drawback to such an arrangement is that a memory cell can remain selected while the write enable signal /WE is active. During such a time period, a current can flow through a digit line from a de-selected memory connected to the same word line. Such a current can contribute to overall current consumption in a SRAM circuit.

Another drawback to a conventional true asynchronous SRAM circuit is the timing constraints that may be presented by such circuits. In particular, a true asynchronous SRAM circuit that is undergoing a write operation to one address may undergo a subsequent transition to a second address. To prevent the write data from being erroneously written into the second address, a SRAM circuit may include a specification TWR that indicates a minimum time between the termination of a write enable (/WE) pulse and a subsequent address transition. Such a TWR specification is shown in FIG. 10. A TWR requirement may increase the overall time required to access an SRAM cell, thus decreasing the operating speed of the SRAM device.

A second type of asynchronous SRAM circuit can operate internally in a similar fashion to a synchronous SRAM device. Namely, internal timing pulses can be generated to control read and/or write operations. However, unlike a synchronous SRAM circuit, such internal timing pulses are not generated in response to an externally applied periodic signal, but instead are generated in response to various transitions in other applied input signals. One such type of SRAM circuit can be referred to as a "pulse" word system. In a pulse word system, a memory cell can be selected at the particular time the read and write operations are taking place. More particularly, a pulse word system can generate timing pulses in response to transitions in address values and in response to transitions in write data values.

An example of a pulse word SRAM circuit operation is shown in FIG. 11a. FIG. 11a is a timing diagram showing an address value ADD, a chip select signal /CS, a write enable signal /WE, a data input value DIN, and an indication of selected word line values (PW). In FIG. 11a, a chip select signal /CS can be active (low in this case) while a write enable signal is inactive (high). In addition, the address can make a transition to a value A0. In response to the address transition, a pulse word signal (PULSE WL) can be activated, and data can be read from a memory cell corresponding to address A0.

Next, a write enable signal can be activated (transition low) while the chip select signal /CS is active (low) indicating a write operation. Further, an address can transition from an A0 value to a value A1. FIG. 11a particularly shows a "long" write operation where write data values may transition one or more times while a write enable signal is active. Consequently, a memory cell at address A1 can be written essentially multiple times.

In the above arrangement, because a memory cell is selected when the pulse word signal is active, the period of time during which a memory cell is selected can be less than that of a true asynchronous SRAM circuit. Consequently, current consumption can be reduced over a true asynchronous SRAM circuit approach.

Various examples of pulse word SRAM circuits are shown in Japanese Unexamined Patent Publication No. Hei 1-241089, Japanese Unexamined Patent Publication No. Hei 5-74162, and Japanese Unexamined Patent Publication No. Hei 8-222000.

However, as noted above, in a pulse word SRAM circuit a "long" write operation can take place. In a long write case, a pulse word signal (PW) can be generated for each transition in the write data. Consequently, the amount of time that a memory cell remains selected can be increased, essentially defeating the current saving features of a pulse word SRAM circuit. Still further, as the number of write data transitions increases, more current can be consumed.

It is further noted that a pulse word SRAM circuit may introduce time constraints between operations. More particularly, when a write operation occurs in a pulse SRAM, a precharge operation may be required before a subsequent read operation is performed. A precharge operation can precharge digit lines prior to a read operation. Thus, in a pulse word SRAM, reading may have to be postponed until after a precharge operation. For example, when the next read address is applied immediately after a write operation, the write data may still be on the digit line pair (D and /D) causing incorrect data to be read. Thus, it is necessary to precharge the digit line pair (D and /D) after a write operation. Therefore, a read following a write must be delayed by a TWR requirement to allow proper precharge levels to be reached on the digit line pair (D and /D). This can reduce the overall operating speed of a pulse SRAM circuit. While many conventional SRAM circuits include 6-T memory cells as previously described, in recent years a more compact memory cell has been proposed in an effort to provide higher density SRAM devices. The proposed memory cell is a "true" four transistor (4-T) memory cell. A true 4-T memory cell can omit the load devices (e.g., transistors or resistors) present in a 6-T memory cell.

One example of a 4-T memory cell is shown in FIG. 12. The 4-T memory cell of FIG. 12 is shown to include a pair of driver transistors NMOS1 and NMOS2 having cross-coupled gates-drain connections at nodes N1 and N2. Driver transistors (NMOS1 and NMOS2) can be n-channel insulated gate field effect transistors (IGFETs). Access transistors PMOS1 and PMOS2 can connect nodes N1 and N2 to digit lines D and /D. Access transistors (PMOS1 and PMOS2) can be p-channel IGFETs.

The gates of access transistors (PMOS1 and PMOS2) can have gates that are connected to a word line. Driver transistors (NMOS1 and NMOS2) can have source-drain paths connected between nodes N1 and N2 and a low power supply voltage.

In a 4-T memory cell, data may be retained by supplying power to a digit line (D or /D) through a precharging circuit (not shown). With power supplied to a digit line, a sub-threshold leakage current can pass across the source-drain path of an access transistor (PMOS1 of PMOS2) and thereby maintain a corresponding storage node (N1 or N2) at a high potential. In this way, data values can be maintained by a precharge operation.

While 4-T memory cells can provide for denser memory cell arrays, incorporating such memory cells into conventional SRAM circuit architectures can be problematic. For example, using a 4-T memory cell in a true asynchronous SRAM circuit described above, may lead to loss of data. In particular, when a word line is activated, a 4-T memory cell that is not connected to a selected column (e.g., its corresponding digit line pair is not selected) an have its nodes connected to digit lines, one of which can be at a relatively low potential. If a charged (high) node is connected to a digit line at a low power supply level by its corresponding access transistor, the charged node can be discharged, thereby destroying the data stored in the memory cell. For these reasons, it has been difficult to implement 4-T memory cells in a true asynchronous SRAM circuit.

In a true asynchronous SRAM circuit a write enable signal /WE controls the beginning and end of a write cycle. In a "long" write cycle one digit line from a digit line pair (D and /D) may be forced to a low power supply level for a long period of time. In an SRAM using 4-T memory cells, this can destroy high logic level data on an unselected memory cell in which the high logic level is stored at the node corresponding to the digit line forced to the low logic level.

FIG. 11b is a timing diagram illustrating an example of a "long" write cycle in a pulse word asynchronous SRAM circuit in which the above mentioned condition may occur. The timing diagram of FIG. 11b shows an address value ADD, a chip select signal /CS, a write enable signal /WE, a data input value DIN, and an indication of selected word line values (PW). The timing diagram of FIG. 11b also includes a digit line pair (D, /D) in which a true digit line D is shown as a solid line and a complementary digit line /D is shown as a dashed line. The timing diagram of FIG. 11b includes a "Disturb Condition." During the disturb condition a data input value may change temporarily due to system noise. System noise can be caused by other chips that commonly use a data bus. If the input data DIN transitions are spaced in a short enough time period, a pulse word signal (PW) will be continuously high. Yet, the short data input value DIN glitches may not be long enough to switch the logic levels on the digit line pair (D, /D). This can be seen in FIG. 11b in which the time period of the "0" data value is much shorter than the "1" data value. If a 4-T memory cell is used, this can cause one of the digit lines (in this case /D) to be at a low logic level long enough to destroy data on unselected memory cells connected to the same digit line pair (D and /D). However, this will not cause a problem in a 6-T memory cell because a Vdd power supply line is routed separately to the memory cells and data can stay refreshed.

It is noted that while many of the above issues have been discussed for SRAM circuits, the same or similar issues may exist for other types of semiconductor memory devices. For example, when a write occurs in a Dynamic Random Access Memory (DRAM) the write data must achieve a sufficient voltage level in the selected memory cell before a precharge can occur. When a read is following a write, digit lines must be precharged before the read cycle can occur. Accordingly, a DRAM also has a timing specification TWR that indicates a minimum time from a write cycle to a subsequent read cycle. This TWR requirement may increase the overall time required to access a DRAM cell, thus decreasing the operating speed of the DRAM device.

In light of the above discussion it would be desirable to arrive at an SRAM and a DRAM circuit capable of achieving relatively fast access speeds.

Further, it would also be desirable to arrive at a SRAM circuit that can reduce current consumption over conventional approaches but maintain relatively fast access speeds.

Further, it would also be desirable to arrive at an asynchronous SRAM circuit that can include 4-T memory cells.

SUMMARY OF THE INVENTION

According to the disclosed embodiments, a semiconductor memory device may store write data provided in one write cycle, and then write the stored write data to a selected memory cell on a subsequent write cycle. Such a "delayed" write operation may occur in response to a pulse signal generated internally to the semiconductor, memory device.

According to one aspect of the embodiments, a semiconductor memory device includes a static random access memory (SRAM) circuit having a memory cell array with a number of SRAM cells that are selected according to a received address. The SRAM may further include address registers that can store a write address value during one write cycle, and then provide the stored write address value on a subsequent write cycle.

According to another aspect of the embodiments, an SRAM circuit of the semiconductor memory device may include an address transition detector that can detect a change in the received address and generate a timing pulse in response thereto. The timing pulse can be used to generate timing signals to read data from and write data to the SRAM.

According to another aspect of the embodiments, the SRAM may include a write data register that can store write data during one write cycle for an address. If a read operation is subsequently performed to the same address, the stored write data can be provided as the read data.

According to another aspect of the embodiments, a SRAM circuit may store write data at the end of a write enable signal, preventing the unnecessary selection of memory cells during a long write operation in which write data values may change more than once during the write operation.

According to another aspect of the embodiments a SRAM circuit may generate internal timing signals that are not based on a synchronous external timing signal. Further, such timing signals can generate pulse word signals that can be used to read and write data. The SRAM circuit may further include a number of SRAM cells that are "true" four transistor (4-T) memory cells. Such true 4-T memory cells can include two driver transistors having gate-drain connections that are cross-coupled to storage nodes, as well as two access transistors that connect the storage nodes to a digit line pair.

According to one aspect of the embodiments, the true 4-T memory cells can include driver transistors that are n-channel transistors and access transistors that are p-channel transistors.

According to another aspect of the embodiments, a semiconductor memory device may include a dynamic random access memory (DRAM) circuit having a memory cell array of DRAM memory cells, an address register circuit, and a data register circuit. An address register circuit may store a write address from a previous cycle. In response to a change in address, an address register circuit may output a stored write address. A data register circuit may store write data from a previous write cycle.

According to another aspect of the embodiments, a DRAM circuit of a semiconductor memory device may receive a write enable signal, and generate a row enable signal, a column enable signal, and a sense amplifier enable signal as pulse signals. In response to a row enable signal, column enable signal, and sense amplifier enable signal, write data previously stored in a data register circuit may be written to a location corresponding to a write address previously stored in an address register circuit.

According to another aspect of the embodiments, a DRAM circuit of a semiconductor memory device may perform a refresh operation following a data write operation. A data write operation may be a delayed write operation as described above.

DETAILED DESCRIPTION OF THE EMBODIMENTS

The present invention will now be described in detail with reference to a number of drawings.

Figure 1:
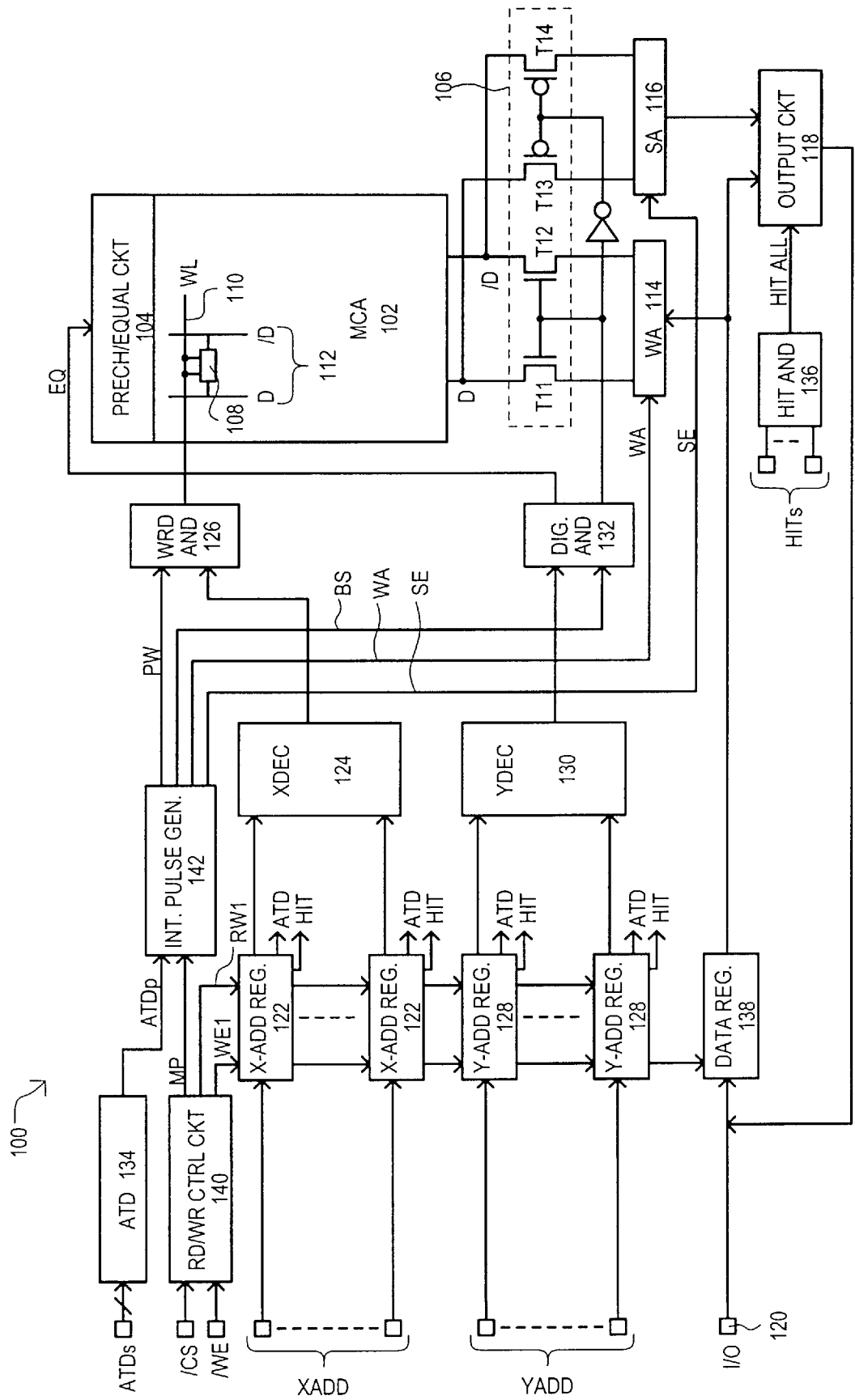
FIG. 1 is a block diagram of a static random access memory (SRAM) circuit according to one embodiment of the present invention.
Figure 9A:
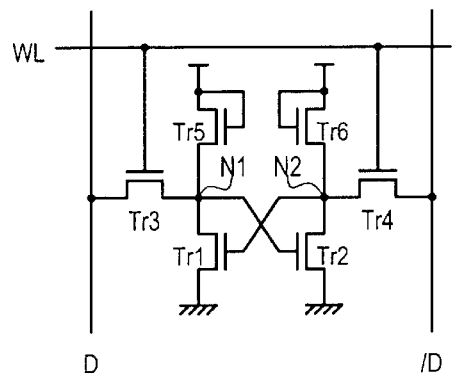
FIG. 9a is a schematic diagram of one type of six transistor SRAM memory cell.
Figure 9B:
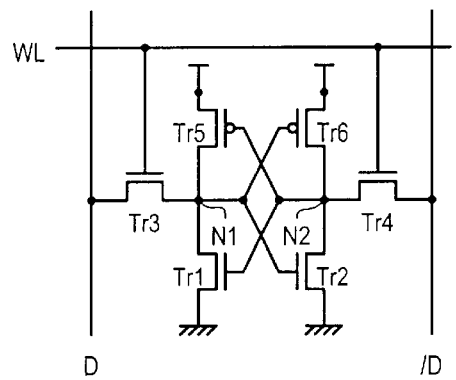
FIG. 9b is a schematic diagram of another type of six transistor SRAM memory cell.
Figure 10:
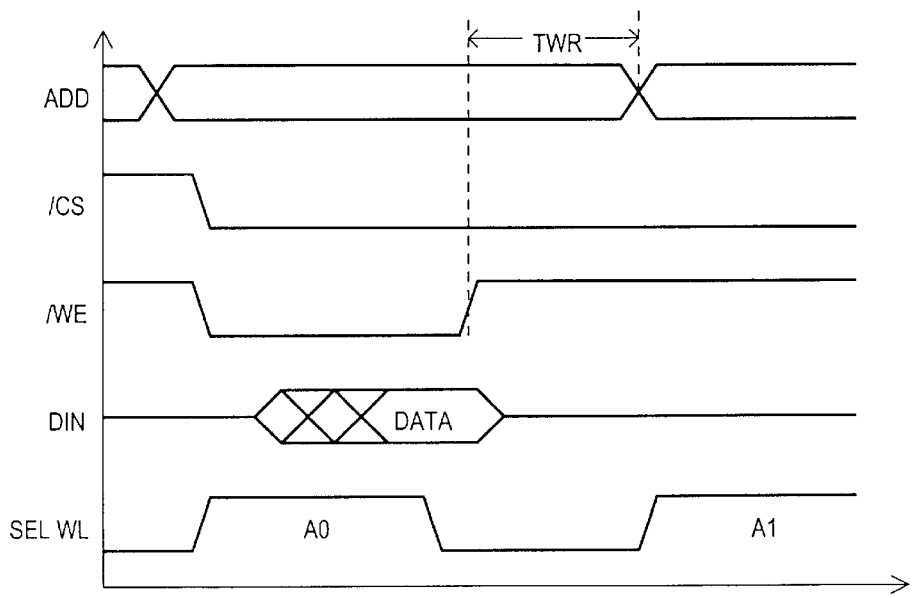
FIG. 10 is a timing diagram illustrating the operation of a conventional true asynchronous SRAM circuit.
Figure 11A:
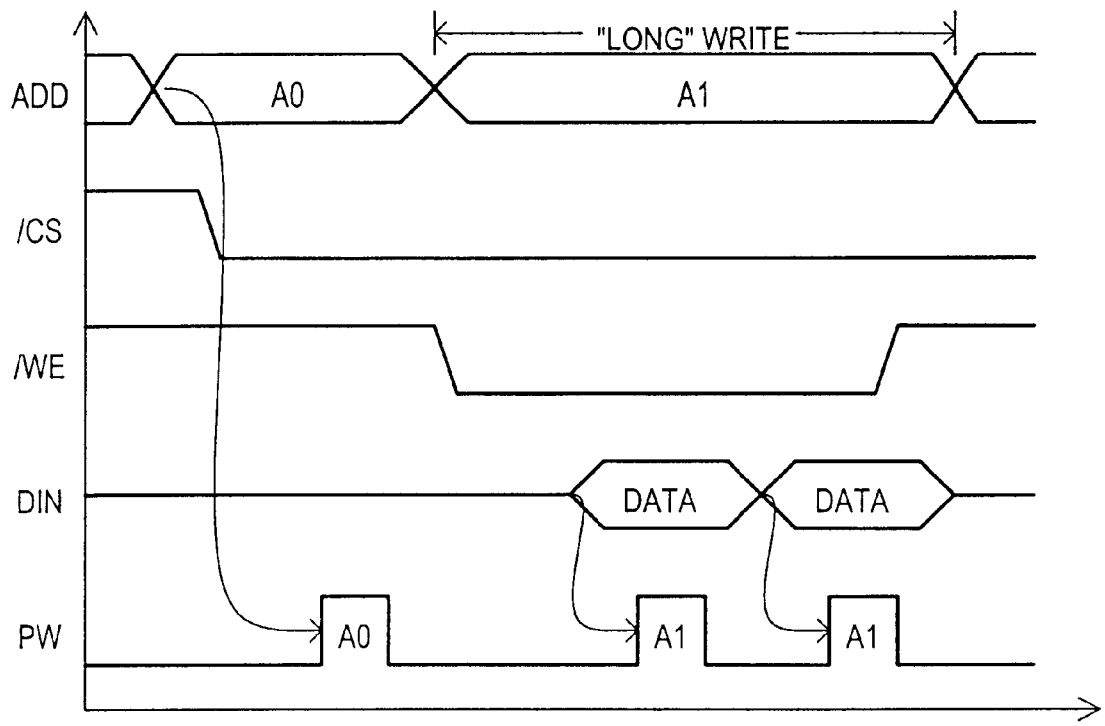
FIG. 11a is a timing diagram illustrating the operation of a conventional pulse word SRAM circuit.
Figure 12:
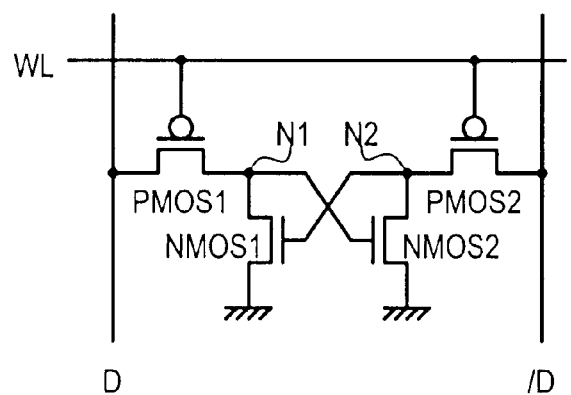
FIG. 12 is a schematic diagram of a four transistor SRAM memory cell.
Figure 11B:
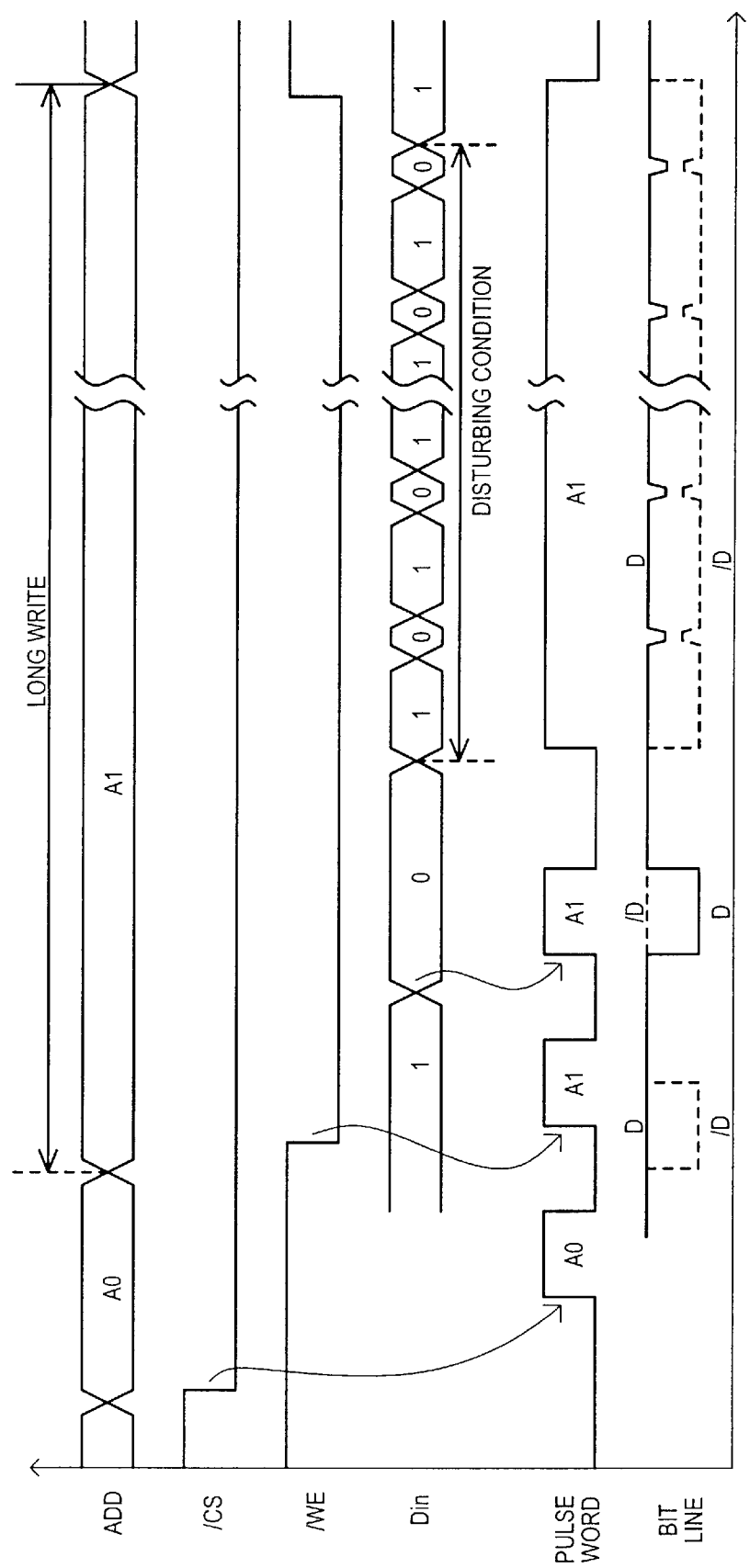
FIG. 11b is a timing diagram illustrating a disturb condition of a conventional pulse word SRAM circuit.

Referring now to FIG. 1, a block diagram is set forth illustrating a static random access memory (SRAM) circuit according to one embodiment of the present invention. The SRAM circuit is designated by the general reference character 100 and is shown to include a memory cell array (MCA) 102 that can be connected to a precharge/equalization circuit 104 and a column switch circuit 106. In the particular example of FIG. 1, a memory cell array 102 may include a number of six transistor (6-T) memory cells, such as that shown in FIGS. 9a and/or 9b. One memory cell is shown by way of example in FIG. 1 as item 108, and may be connected to a word line 110 and a digit line pair (D and /D) 112. Digit line pairs (such as 112) within memory cell array 102 may be connected to a precharge/equalization circuit 104 and column switch circuit 106.

A precharge/equalization circuit 104 may precharge digit line pairs in a precharge operation. Such a precharge operation can precharge digit line pairs to a high supply voltage, a low supply voltage, or some intermediate voltage therebetween. A column switch circuit 106 may select particular digit line pairs to access particular memory cells (such as during a read or write operation). In the particular arrangement of FIG. 1, a column switch circuit 106 may include a number of column select transistors (T11, T12, T13 and T14). In the particular arrangement of FIG. 1, select transistors T11 and T12 can be n-channel insulated gate field effect transistors (IGFETs) that provide a write data path while select transistors T13 and T14 can be p-channel IGFETs that provide a read data path. Of course, such column select transistors (T11 to T14) could be of the same conductivity type in other embodiments.

A SRAM circuit 100 may also include a write amplifier circuit 114 and a sense amplifier circuit 116. A write amplifier circuit 114 can receive a write data value, amplify such a write data value, and supply it to a memory cell selected by column switch circuit 106 and an activated word line. A sense amplifier circuit 116 can receive read data on a pair of digit lines, amplify such read data, and supply it to an output circuit 118. The particular example of FIG. 1, an input/output (I/O) terminal 120 can receive write data and provide read data.

A particular word line may be selected according to an X-address (XADD), and a particular digit line pair may be selected according to a Y-address (YADD). The particular SRAM circuit 100 of FIG. 1 includes an X-address register 122 corresponding to each bit of an X-address. An X-address stored in registers 122 can be provided to an X-decoder circuit 124. X-decoder circuit 124 can decode an X-address and provide an X-select signal to a corresponding word AND gate, one of which is shown as item 126.

The particular SRAM circuit 100 of FIG. 1 also includes a Y-address register 128 corresponding to each bit of a Y-address. A Y-address stored in registers 128 can be provided to a Y-decoder circuit 130. A Y-decoder circuit 130 can decode a Y-address and provide a Y-select signal to a corresponding digit AND gate, one of which is shown as item 132.

As also shown in FIG. 1, each X-address register 122 and Y-address register 128 can provide an address transition detect signal (ATD), as well as a "hit" signal (HIT). The various ATD signals can be provided to an ATD circuit 134. Further, the various HIT signals can be provided to a hit AND gate 136.

A SRAM circuit 100 according to one embodiment may further include a data register 138. A data register 138 may be situated between an I/O terminal 120 and a write amplifier circuit 114. The data register 138 may also be situated between the I/O terminal 120 and an output circuit 118. In a write operation, write data may be input to a write amplifier circuit 114 by way of data register 138.

However, data from a data register 138 may also be provided as an input to output circuit 118. Further, the operation of an output circuit 118 can be controlled by hit AND gate 136. In particular, when hit AND gate 136 provides one output value, an output circuit 118 can provide read data from a sense amplifier circuit 116. However, when hit AND gate 136 provides another output value, output circuit 118 can provide the data stored in data register 138 as an output value.

SRAM circuit 100 further includes a read/write control circuit 140. A read/write control circuit 140 can receive a write enable signal /WE and a chip select signal /CS. In response to the /WE and /CS signals, a read/write control circuit 140 can output an internal write enable signal WE1, a read/write switch signal RW1, and a main pulse signal MP. The internal write enable and read/write switch signals (WE1 to RW1) can be provided to the X-address registers 122 and Y-address registers 128. Further, the internal write enable signal WE1 can also be provided to data register 138.

A main pulse signal MP can be a one-shot pulse that is generated in response to transition in a write enable signal.

An internal pulse generator 142 can receive the main pulse signal MP and an ATD pulse (ATDp) from ATD circuit 134. In response to various inputs, internal pulse generator 142 can output a pulse word signal PW, a block select signal BS, a sense amplifier enable signal SE, and a write amplification activation signal WA.

A pulse word signal PW can be provided as one input to word AND gates 126. Another input to word AND gates 126 can be an X-select signal from X-decoder circuit 124. The output of word AND gates 126 can then select a particular word line.

A block select signal BS can be provided as one input to digit AND gates 132. Another input to digit AND gates 132 can be a Y-select signal from Y-decoder circuit 130. In response to the various input signals, digit AND gates 132 can generate column select signals that are received by column switch circuit 106. According to the column select signal, a column switch circuit can select a particular digit line pair. A digit AND gate 132 can also generate an equalization signal EQ that is provided to precharge/equalization circuit 104. In response to the equalization signal EQ, precharge/equalization circuit 104 can precharge digit line pairs or "release" such digit line pairs from the precharge/equalized state.

A sense amplifier enable signal SE can activate a sense amplifier circuit 116. A write amplification activation signal WA can activate a write amplifier circuit 114.

Having described various components of a SRAM 100 according to one embodiment, various components that may be used in the SRAM 100 will now be described in more detail.

Figure 2:
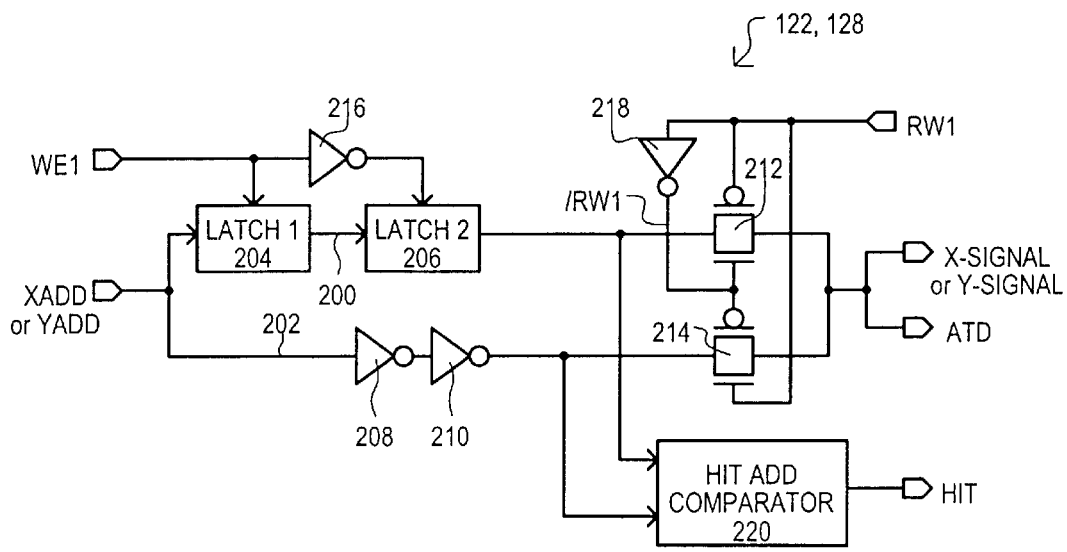
FIG. 2 is a circuit diagram showing an address register circuit according to an embodiment.

In particular embodiments, X-address registers 122 and Y-address registers 128 can have the same structure. One such address register is shown in FIG. 2, and is designated by the general reference characters 122, 128.

An address register (122, 128) may include a write path 200 and a read path 202. A write path 200 may include a first latch 204 and second latch 206 arranged in series. A read path 202 may include a first buffer 208 and second buffer 210 arranged in series. A write path 200 value can be output by way of a first gate 212, while a read path 202 value can be output by way of a second gate 214.

First and second latches (204 and 206) may be controlled by an internal write enable signal WE1. In particular, first latch 204 can receive the internal write enable signal WE1, while second latch 206 can receive the internal write enable signal by way of an inverter 216. Thus, when the internal write enable signal WE1 has one value, a first latch 204 may have a "through" state while a second latch 206 may have a "latching" state. Conversely, when the internal write enable signal WE1 has another value, a first latch 204 may have the latching state while a second latch 206 may have the through state. In one arrangement, when a latch is in the through state, data at its input can pass through the latch and be provided as an output. When a latch is in the latching state, data is latched in the latch and provided as an output value, and changes at the latch input do not affect the latched value.

First and second gates (212 and 214) may be controlled by read/write switch signal RW1. In particular, when read/write switch signal RW1 has one value, first gate 212 can be enabled, and when read/write switch signal RW1 has another value, second gate 214 can be enabled. Because the first and second gates (212 and 214) of the embodiment of FIG. 2 are complementary metal(conductor)-oxide (insulator)-semiconductor (CMOS) transfer gates, an inverter 218 is included to generate complementary read/write switch signals RW1 and /RW1. The output from first or second gates (212 or 214) can be an ATD output and an input to an address decoder.

An address register (122, 128) may further include a hit address comparator 220 having one input connected to the write path 200 and another input connected to the read path 202. When the inputs of the hit address comparator 220 match, a HIT output signal can be activated.

Figure 3:
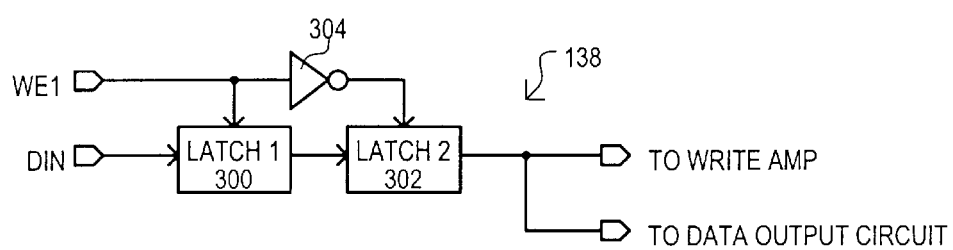
FIG. 3 is a circuit diagram showing a data register circuit according to an embodiment.

An example of data register 138 that may be used in the embodiment of FIG. 1 is shown in FIG. 3. The data register 138 of FIG. 3 includes a first latch 300 and a second latch 302. The first and second latches (300 and 302) can be arranged in series, and receive an input data value DIN. The output of second latch 302 can be provided to both a write amplifier circuit and a data output circuit. A first latch 300 may be controlled by an internal write enable signal WE1. A second latch 302 may be controlled by an internal write enable signal inverted by an inverter 304. In this arrangement, when the internal write enable signal WE1 has one value, a first latch 300 may have a "through" state while a second latch 302 may have a "latching" state. Then, when the internal write enable signal WE1 has another value, a first latch 300 may have the latching state while a second latch 302 may have the through state.

Having described the structure of an SRAM circuit 100 according to various embodiments, the operation of an SRAM circuit according to one embodiment will now be described.

Figure 4:
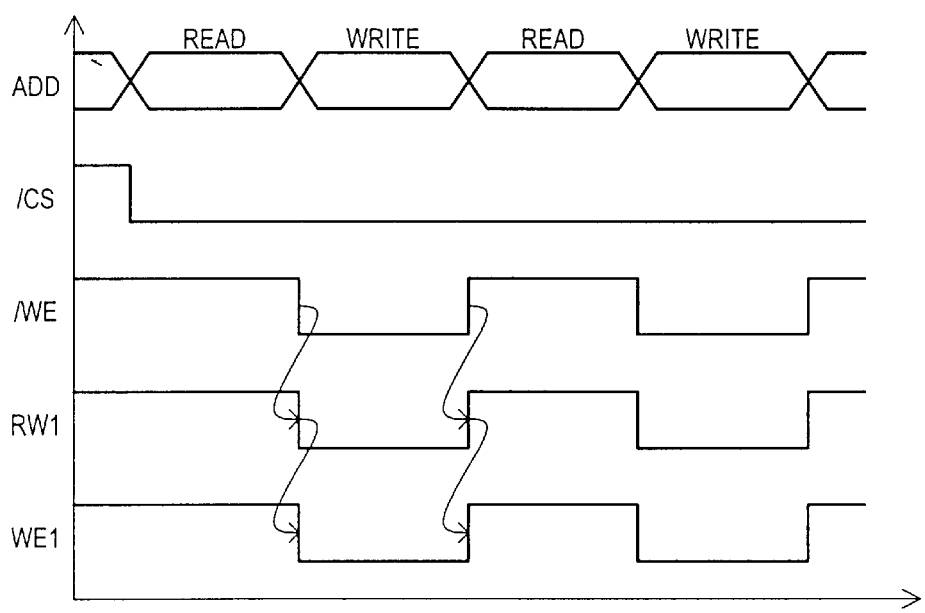
FIG. 4 is a timing diagram illustrating read and write operations for a SRAM circuit according to one embodiment.

Referring now to FIG. 4, a timing diagram is set forth illustrating read and write operations according to one embodiment. The operations of FIG. 4 will be described with reference to FIGS. 1–3. Initially, a read/write control circuit 140 can receive a chip select signal /CS and write enable signal /WE that are both inactive (high). With the write enable signal /WE inactive, the read/write switch signal RW1 is high and the internal write enable signal WE1 can be high.

A chip select signal /CS can then transition low while the write enable signal /WE is high, indicating a read operation. An address value ADD can transition, providing an address for the read operation. A memory cell from memory cell array 102 can be selected according to the applied address and output to a sense amplifier circuit 116 through column switch circuit 106. A sense amplifier circuit 116 can amplify read data which can be output to an I/O terminal 120 by way of output circuit 118.

With a chip select signal /CS low, the write enable signal WE1 can then transition low indicating a write operation. An address value ADD can transition, providing an address for the write operation. With a write enable signal /WE low, the read/write switch signal RW1 and the internal write enable signal WE1 can both be low.

Within address registers (122, 128), because the internal write enable signal WE1 is low, a first latch 204 can be in a through state while second latch 206 can be in a latching state. Thus, received address values can be present in a first latch 204, while a second latch 206 can output a previously latched address value.

Further, with the read/write switch signal RW1 low, first gate 212 can be enabled while a second gate 214 can be disabled. In such an arrangement, the address value previously latched in the second gate 214 can be output to an address decoder circuit (124 or 130) and ATD circuit 134.

Within data register 138, because internal write enable signal WE1 is low, a first latch 300 can be in a through state while second latch 302 can be in a latching state. Thus, a received data write value can be present in a first latch 300, while second latch 302 outputs a previously latched data value.

A write enable signal /WE may then return high. Consequently, the internal write enable signal WE1 and read/write switch signal RW1 can transition high.

Within address registers (122, 128), because the internal write enable signal WE1 is high, a first latch 204 can be in a latching state while second latch 206 can be in through state, outputting the address value stored in the first latch 204. With the read/write switch signal RW1 high, first gate 212 can be disabled while a second gate 214 can be enabled. Thus, an address value previously latched during a write operation is prevented from being output from the address register (122, 128). Instead, a currently supplied read address value can be output by way of second gate 214.

Within data register 138, because the internal write enable signal WE1 is high, first latch 300 can be in a latching state while second latch 302 can be in a through state. Thus, a previously received data value can be output from a second latch 302. However, because a read operation is currently taking place, a write amplifier is disabled and data provided by data register 138 is not written into a memory cell array 102.

Figure 5:
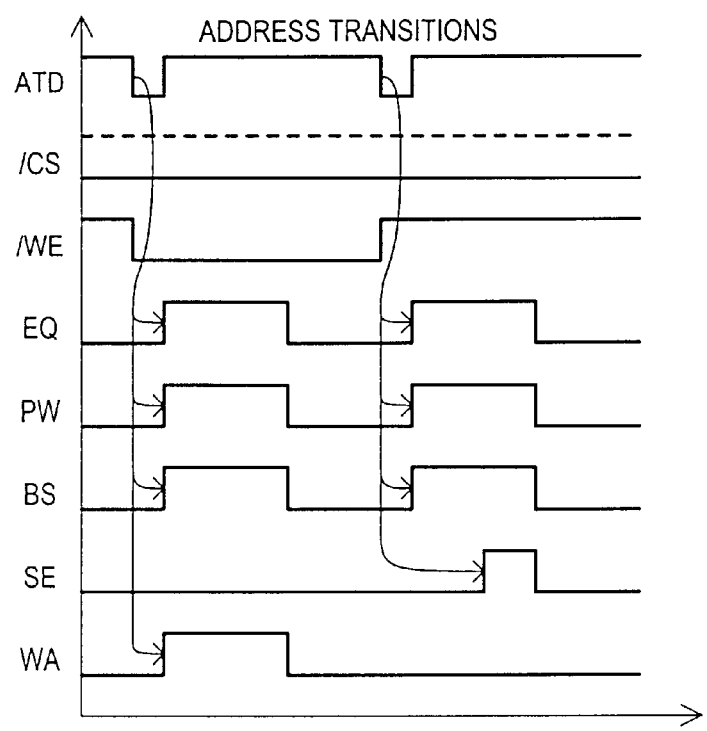
FIG. 5 is a timing diagram illustrating the generation of internal timing signals when address transitions occur according to one embodiment.

Referring now to FIG. 5, a timing diagram is set forth illustrating a write operation followed by a read operation that includes a change in address. The operations of FIG. 5 will be described with reference to FIGS. 1–3. Initially, an applied address value can make a transition while the write enable signal /WE and chip select signal /CS are both active (low in this example), indicating a write operation. Address values, in the form of ATD outputs from address registers (122, 128), can be provided to ATD circuit 134. In response to a change in at least one address bit value, ATD circuit 134 can generate a pulse, shown as a low-going ATD pulse in FIG. 5. An ATD pulse can be a "one-shot" pulse, as but one example.

An ATD pulse can result in the generation of an equalization signal EQ pulse, a pulse word signal PW pulse, a block select signal BS pulse, and a write amplifier activation signal WA pulse. It is noted that because the write enable signal /WE is active, a sense amplifier signal SE pulse is not generated. In one particular arrangement, the various pulses may be generated by circuits that receive the ATD pulse and extend its duration with delay circuits. In the case of a write amplifier activation WA signal, such a pulse may be enabled when the write enable signal /WE is low. In the case of a sense amplifier enable signal SE, such a pulse may be enabled when the write enable signal /WE is high.

An equalization signal EQ pulse (high-going in this example) can release digit lines from a precharged/equalized state and thereby allow data to be written into a memory cell. A pulse word signal PW pulse, when logically ANDed with an X-select signal from X-decoder circuit 124, can activate a word line, thereby selecting a row of memory cells. A block select signal BS pulse, when logically ANDed with a Y-select signal from Y-decoder circuit 130, can result in column switch circuit 106 selecting a digit line pair from the selected row of memory cells. A write amplifier activation signal WA pulse can activate write amplifier circuit 114, which can amplify received write data, thereby writing the data into the selected memory cell. In this way a memory cell can be selected for writing.

Next, in the example of FIG. 5, a second address transition can occur while the write enable signal /WE is inactive (high) and the chip select signal is active (low), indicating a read operation. Operations may proceed in the same general way as a write operation described above, however a write amplifier activation signal WA is not activated and instead the sense amplifier enable signal SE is activated. With the sense amplifier enable signal SE activated, a sense amplifier circuit 116 can amplify data from the selected digit line pair, and output it by way of output circuit 118.

Figure 6:
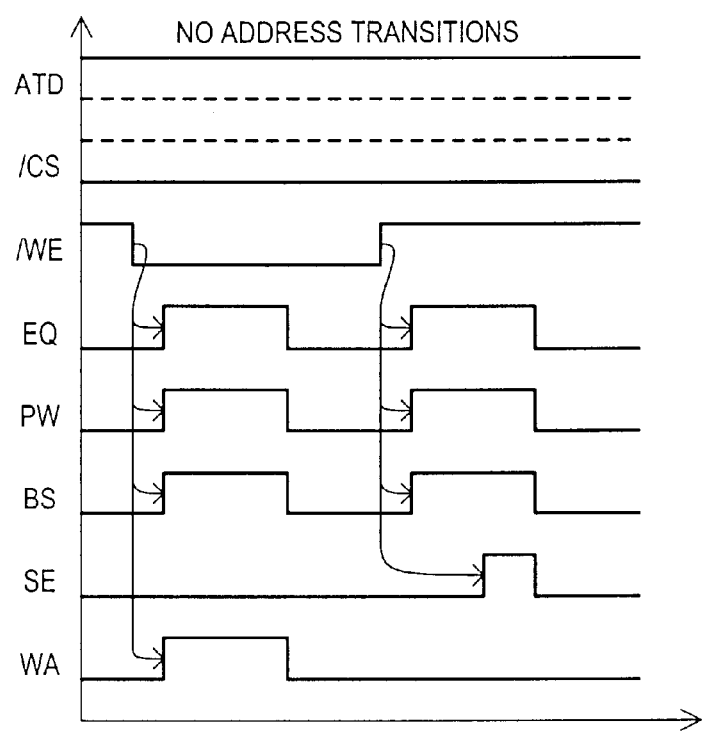
FIG. 6 is a timing diagram illustrating the generation of internal timing signals when address transitions do not occur according to one embodiment.

Referring now to FIG. 6, a timing diagram is set forth illustrating write operation followed by a read operation where a change in address does not occur. Because no change in address occurs, no ATD pulse is generated. However, as will be recalled, a read/write control circuit 140 can generate a main pulse signal MP. More particularly, a read/write control circuit 140 can provide a main pulse signal MP to internal pulse generating circuit 142 in response to transitions in a write enable signal /WE. Further, in the event an ATD pulse is not generated the main pulse signal MP can be used to generate the various timing signals described in conjunction with FIG. 5.

That is, in the absence of an ATD pulse, a main pulse signal MP pulse can result in the generation of an equalization signal EQ pulse, a pulse word signal PW pulse, a block select signal BS pulse, and a write amplifier activation signal WA pulse. It is noted that like the ATD pulse case, because the write enable signal /WE is active, a sense amplifier signal SE pulse is not generated. As in the case of the operations discussed in conjunction with FIG. 5, the various pulses may be generated by circuits that receive the MP pulse and include delay circuits to increase the duration of such a pulse. Such circuits may be disabled when an ATD pulse is detected. Of course numerous other interlocking and logic circuit arrangements can generate the desired result.

Figure 7:
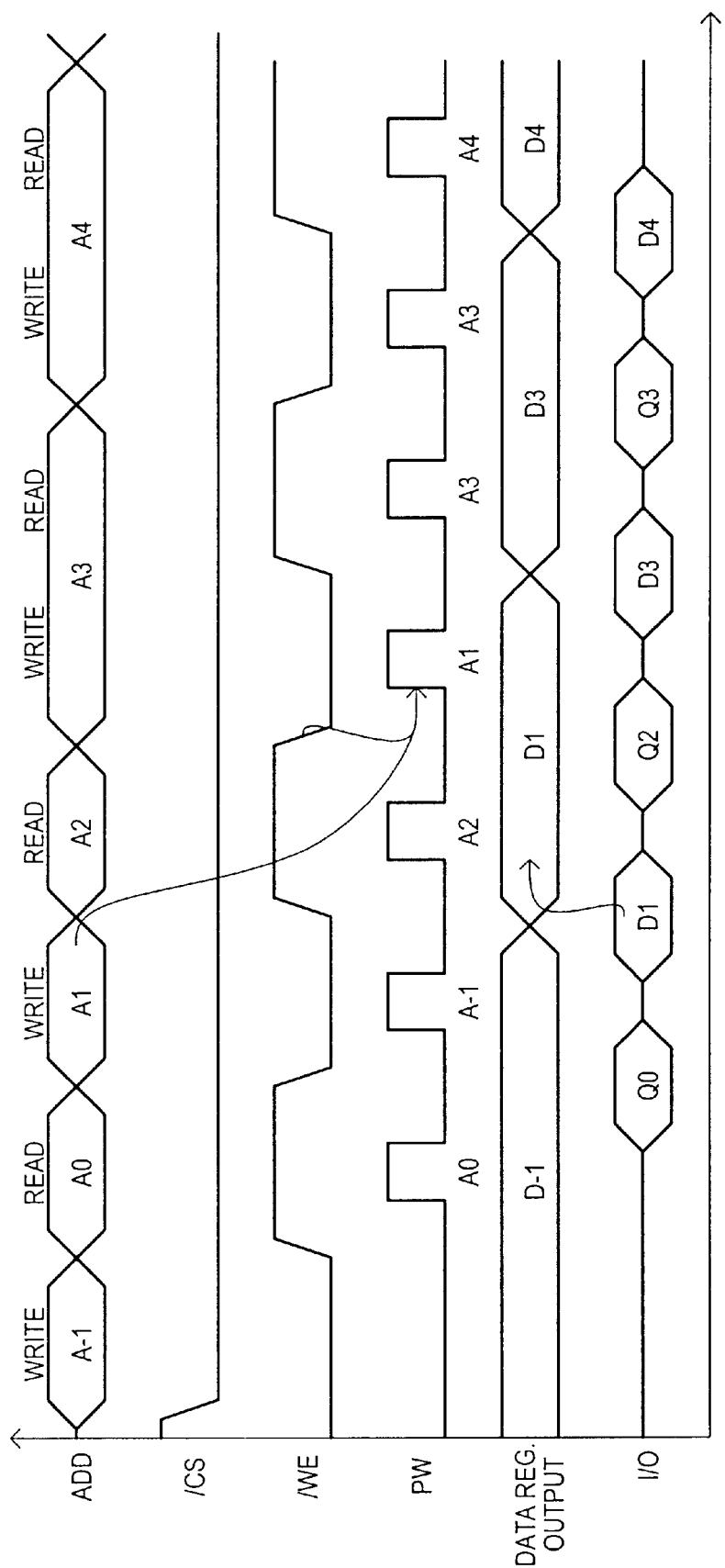
FIG. 7 is a timing diagram illustrating read and write operations according to one embodiment.
Figure 8:
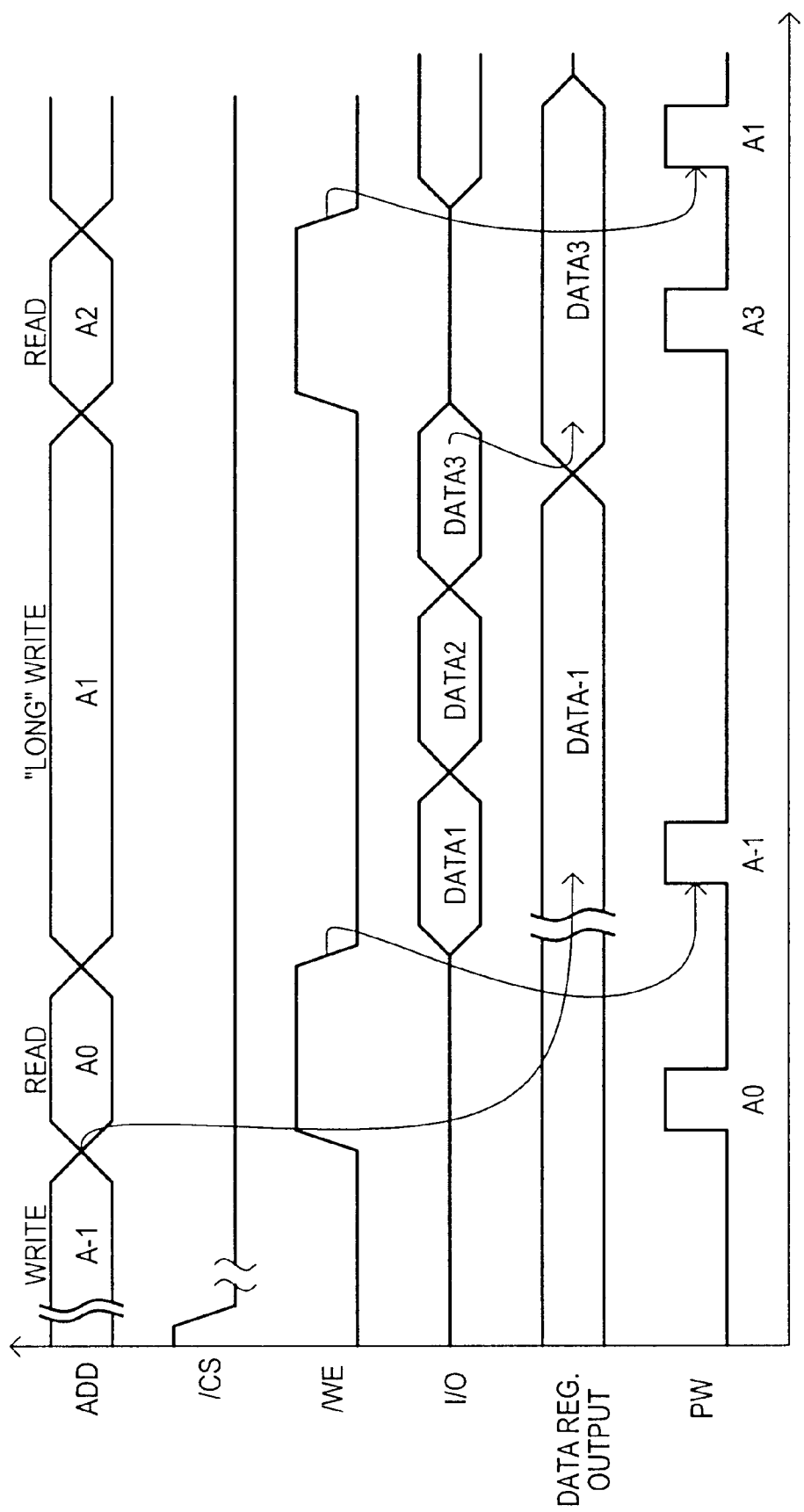
FIG. 8 is a timing diagram illustrating read and write operations, including a "long" write operation according to one embodiment.

Having described the generation of timing signals for when address transitions occur and do not occur, read and write operations according to one embodiment are further detailed in FIGS. 7 and 8.

Referring now to FIG. 7, various read and write operations are illustrated. As shown in FIG. 7, an address value can transition from a value "A−1" to a value "A0." In addition, a chip select signal /CS can be active (low) while a write enable signal /WE can be inactive (high), indicating a read operation.

As previously discussed, within address registers (122, 128), a read address can propagate along a read path 202 to a corresponding X- or Y-address decoder circuit (124 or 130). The transition in address (A−1 to A0) results in the ATD circuit 134 generating an ATD pulse. An ATD pulse can be received by an internal pulse generator circuit 142 and generate a pulse word signal PW pulse, a block select signal BS pulse, and a sense amplifier enable signal SE pulse. A digit AND gate 132 can generate a precharge/equalization signal EQ pulse. In this way a data value Q0 can be amplified by a sense amplifier circuit 116 and output to I/O terminal 120 by way of output circuit 118.

Referring once again to FIG. 7, a "delayed" write aspect according to one embodiment is also illustrated. Following the read operation for address A0, the address makes another transition to address A1. With a chip select signal /CS still active, a write enable signal /WE can be activated (transition low), indicating a write operation.

As previously discussed, within address registers (122, 128), a write address can be received by first latches 204, which are in a "through" state. Thus, the write address value is not immediately applied to corresponding X- and Y-decoder circuits (124 or 130). The transition in address (A0 to A1) results in the ATD circuit 134 generating an ATD pulse, which in turn generates PW, BS, EQ and WA pulses. However, the write amplifier activation signal WA pulse writes previously latched data, and not currently received write data D1.

When the write enable signal /WE returns high, address values A1 can be latched in corresponding second latches 206 within address registers (122, 128). However, because the read/write switch signal RW1 remains high, such address values are still not applied to X- and Y-decoder circuits (124 or 130). Further, the rising /WE edge can result in data register 138 latching write data D1 which is present at I/O terminal 120. Also at this time, as shown in FIG. 7, another read operation can read data Q2 corresponding to read address A2.

A write enable signal /WE can return low once again. It is on this subsequent write operation that previously latched write address value A1 can be applied to X- and Y-address decoders (124 and 130), and previously latched write data D1 can be applied to write amplifier circuit 114. The corresponding transition in address (A2 to A3) can generate the ATD, PW, BS, WA and EQ pulses involved in writing write data D1 to a memory cell selected by write address A1.

In this way, one embodiment can provide a delayed write operation by latching write address and write data values at the conclusion of a write enable pulse, and performing the actual writing of data on a subsequent write enable pulse.

FIG. 7 also illustrates how latched write data can be provided as read data before the latched write data has been written to a memory cell. Such an operation may occur where a write operation to an address is followed by a read operation to the same address.

Referring once again to FIG. 7, it is shown that following the application of the address "A2" the address makes another transition to address "A3." In addition, the write enable signal /WE transitions low, indicating that write data D3 is to be written to address A3. As described above, the write operation is delayed. Thus, when the write enable signal /WE returns high, the write address A3 is latched in address registers (122, 128) and write data D3 is latched in data register 138.

As further shown in FIG. 7, the address is maintained at the value A3, but the write enable signal /WE returns high, indicating a read operation to the same address. Conventionally, such an operation might result in erroneous data as the write data D3 has not yet been written to the memory cell at address A3 (it is still latched in data register 138). Further, in some conventional approaches, because no address transition has occurred, timing signals might not be generated.

However, it will be recalled that address registers (122, 128) can include hit address comparators 220. Hit address comparators 220 can thus indicate when a newly applied read address received on read paths 202 is the same as a previously latched write address output along write paths 200. Such "hit" values can be logically ANDed in hit AND gate 136. If all hit values are active, the write data stored in a data register 138 can be output through output circuit 118.

In this way, one embodiment can provide stored write data as read data before the write data has been written to a memory cell.

FIG. 8 shows a "long" write operation according to one embodiment. In a long write operation, input data values can transition one or more times while the write enable signal /WE is active(low). As will be recalled, in a conventional pulse word type SRAM circuit, a long write operation can result in multiple pulse word signals, causing memory cells of a selected word line to be connected to their corresponding digit line pairs multiple times. This can consume current, and in the case of four transistor (4-T) memory cells, may result in corruption of data.

However, as shown in FIG. 8, the present invention can eliminate such drawbacks by having a single delayed write operation at the end of a write enable signal /WE pulse. More particularly, in FIG. 8 an address can transition from a value A0 to value A1. The write enable signal /WE can also be active (low) at this time. Further, because a "long" write operation occurs, I/O terminal 120 can make three transitions (from DATA1 to DATA2 to DATA3) before the write operation is terminated. As will be recalled, the present invention can generate a control pulse signal at the start of a write operation (either due to an address transition or write enable signal /WE transition) and at the end of a write operation (either due to an address transition, or write enable signal /WE transition). However, during the write operation (i.e., while /WE remains active) such pulses are not generated. Consequently, if a long write operation occurs, only the write data present at the end of the write operation can be latched. This data may then be subsequently written in a late write operation, as previously described.

It is noted that while the above embodiments have described asynchronous SRAM circuits, alternate embodiments may include synchronous SRAM circuits that receive an external timing signal. In such a case, in a write operation, a write address value and write data value may be latched on a particular transition in the timing signal (e.g., a rising CLK edge). On a subsequent write operation, the latched write data value may be written into a memory cell selected according to the latched write address. It is noted that while two cycles may be required between write operations, one cycle may be used to write latched data. Therefore, the data and address buses may be used efficiently.

Further, a synchronous SRAM circuit according to an alternate embodiment could also take advantage of the "hit" circuitry disclosed. Namely, on one clock cycle a write address and write data can be latched. If a read operation is performed to the same address on the next cycle, the latched write data can be output as the read data.

It is also noted that while the embodiments were initially described as including 6-T memory cells, alternate embodiments could include "true" 4-T memory cells. In particular, word line pulses (formed by ANDing a pulse word signal PW and an X-decoder circuit output, for example) may be short enough to enable de-selected memory cells to retain their data. Thus, while a de-selected memory cell may be connected to a digit line at a relatively low potential in a write operation, such a connection may be sufficiently short so as to not destroy any stored data.

Still further, alternate embodiments of the present invention could include pulse word approaches with 4-T memory cells. That is, an embodiment could include various circuit parts shown in FIG. 1, but not include latches for write data and a write address. Instead, write data and write addresses could flow through as in the case of a read operation in FIG. 1. It is not believed that conventional approaches have included such an arrangement with 4-T cells. Again, timing pulses (e.g. a write amplifier activation pulse) could be sufficiently small so as to prevent data in de-selected memory cells from being destroyed.

Figure 13:
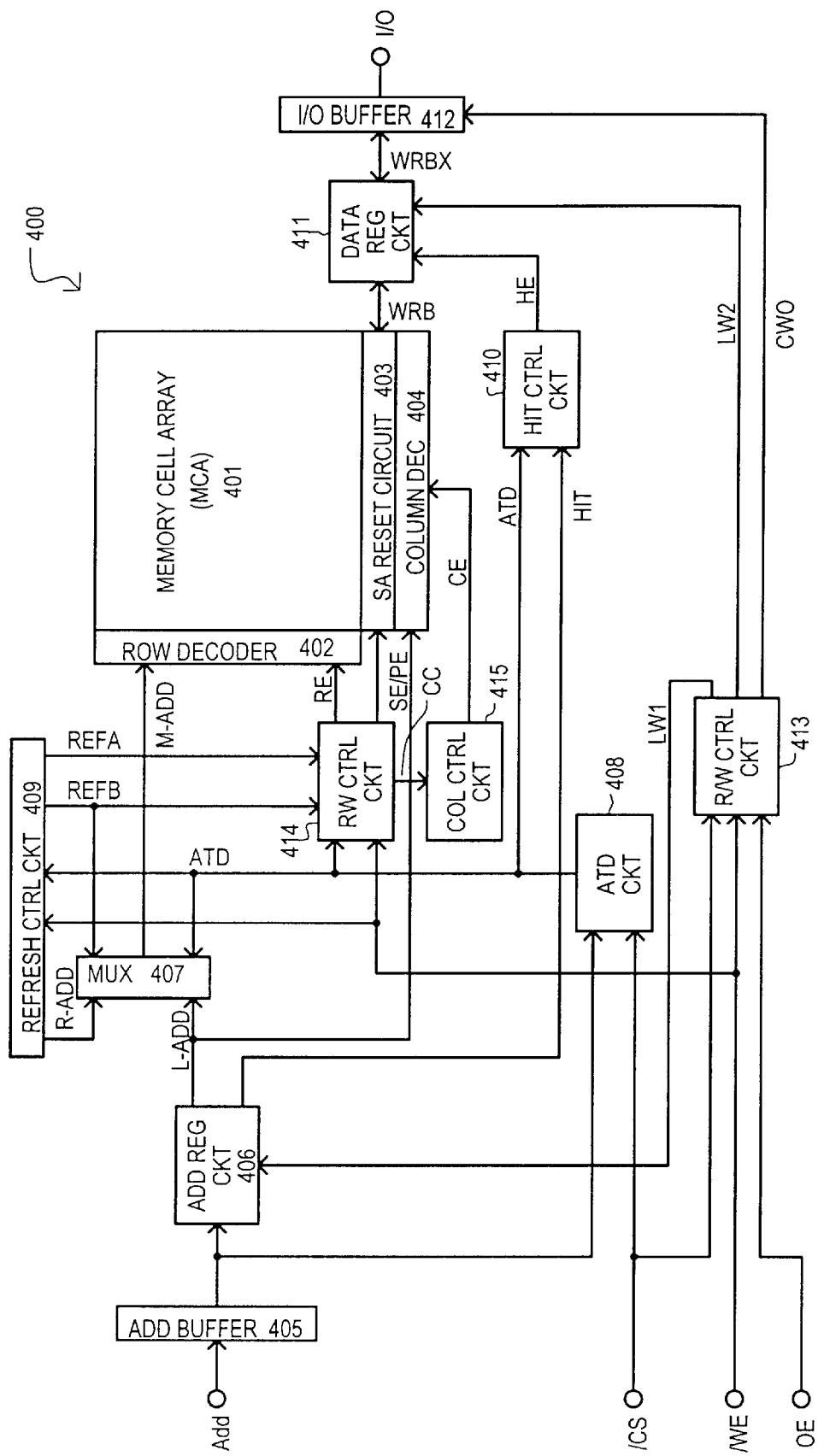
FIG. 13 is a block diagram of a dynamic random access memory (DRAM) circuit according to another embodiment of the present invention.

Referring now to FIG. 13, a block diagram is set forth illustrating a dynamic random access memory (DRAM) circuit according to one embodiment of the present invention. The DRAM circuit is designated by the general reference character 400 and is shown to include a memory cell array (MCA) 401. Memory cell array 401 can include word lines extending in a row direction and bit lines extending in a column direction. Memory cells having a pass transistor and a storage capacitor can be formed at cross points of word lines and bit lines. Memory cell array 401 can further include a row decoder 402, a sense amplifier reset circuit 403 and a column decoder 404.

Row decoder 402 may select a word line in the memory cell array 401 when a write, read or refresh is performed. Row decoder 402 can receive address (M-ADD) and row enable signal (RE). When RE is enabled (logic high in this case), row decoder 402 can activate a word line corresponding to address M-ADD. Column decoder 404 may select a bit line pair (true and complementary bit lines, for example) when a write or read is performed. Column decoder 404 can receive address (L-ADD) and column enable signal (CE). When CE is enabled (logic high in this case), column decoder can select a bit line pair corresponding to address L-ADD. Sense amplifier reset circuit 403 can sense small differential voltages on bit line pairs after a word line is selected during a read operation. Sense amplifier reset circuit 403 can also precharge bit lines at the end of an active cycle. Column decoder 404 can work in conjunction with sense amplifier reset circuit 403 to select a bit line pair during a read or write operation, as will be described.

Sense amplifier reset circuit 403 can include a sense amplifier, a column switch, and a precharge circuit for each bit line pair in memory cell array 401, although these elements are not illustrated. A column switch can receive a column decode signal from the column decoder 404 and can electrically connect a bus WRB and a selected sense amplifier. The column decode signal can be determined by the address L-ADD. When a sense enable signal (SE) is active (high in this case) each sense amplifier can detect and amplify a small differential potential on a corresponding bit line pair. The small differential potential can correspond to a data value stored in a selected memory cell. During a read operation, a sense amplifier selected by the column decoder 404 can output sensed data to bus WRB. During a write operation, a sense amplifier selected by the column decoder 404 can write data supplied by bus WRB into a memory cell. When a precharge enable signal (PE) is active (high in this case), each precharge circuit can precharge a corresponding bit line to a predetermined electric potential, such as one-half a memory cell array power supply potential.

Referring again to FIG. 13, a DRAM circuit 400 may also include an address buffer 405, address register circuit 406, a multiplexer (MUX) 407, an address transition detect (ATD) circuit 408, and a refresh control circuit 409. An address buffer 405 may receive and buffer an address Add. An address Add may be received from a source external to a DRAM circuit 400. A buffered address may be output from address buffer 405 to address register circuit 406.

Address register circuit 406 may receive a buffered address and control signal LW1 as inputs. In response to such inputs, address register circuit 406 may provide an output address L-ADD and a hit signal HIT. An address register circuit 406 may store and output a received address according to the control signal LW1. For example, on a falling edge of control signal LW1, address register circuit 406 may hold a received address Add in built-in registers (not shown). Further, when control signal LW1 is high, address register circuit 406 can output an address held in the built-in registers.

An address register circuit 406 may also include a built-in comparator circuit (not shown). A built-in comparator circuit may compare a newly input address Add with an address stored in built-in register circuits. A hit signal HIT value may vary according to such a comparison. In the particular example of FIG. 13, when a received and stored address are the same, a hit signal HIT may have a high logic level. When a received and stored address are different, a hit signal HIT may have a low logic level.

An ATD circuit 408 may receive an address Add and chip select signal /CS as inputs. In response to such inputs, an ATD circuit 408 may provide an ATD signal. In one arrangement, provided a chip select signal /CS is active (low), an ATD signal can be a one-shot pulse when an address Add changes.

An ATD signal, along with a write enable signal /WE can be input to a refresh control circuit 409. A refresh control circuit 409 may output a refresh address R-ADD and refresh control signals REFA and REFB. A refresh address R-ADD can be used to refresh memory cells of a memory cell array 401.

MUX 407 may receive ATD signal and refresh control signal REFB as control inputs. According to such inputs, a multiplexer 407 can output address L-ADD or refresh address R-ADD as an input address M-ADD to a row decoder 402. In the particular example of FIG. 13, when ATD signal is high (i.e., when an address transition occurs), MUX 407 can output address L-ADD.

FIG. 13 also shows a hit control circuit 410, a data register circuit 411, an input/output (I/O) buffer 412, and a read/write (R/W) control circuit 413. A hit signal HIT may be supplied to hit control circuit 410 along with an ATD signal. When an ATD signal is active, a hit control circuit 410 may output a hit enable signal HE to a register circuit 411.

A R/W control circuit 413 may receive a chip select signal /CS, a write enable signal /WE, and an output enable OE signal as inputs. In response to such inputs, a R/W control circuit 413 can output control signals LW1, LW2 and CW0. A control signal LW1 can be provided to register circuit 406, as noted above. A control signal LW2 can be provided to register circuit 411.

As shown in FIG. 13, a register circuit 411 may be connected to a memory cell array by a bus WRB, and to an I/O buffer by a bus WRBX. The operation of a register circuit 411 may vary according to received control signal LW2 and hit enable signal HE. In the example of FIG. 13, data on a bus WRBX may be input to built-in data registers (not shown) within a register circuit 411 on the falling edge of a control signal LW2. When control signal LW2 has a high level, data stored within the built-in data registers may be output to memory cell array 401.

When control signal LW2 has a low level, the operation of a register circuit 411 can vary depending upon a hit enable signal HE. More particularly, if a control signal LW2 is low and a hit enable signal HE is high, write data to be written to a memory cell array 401 can be output onto a bus WRBX. However, if a control signal LW2 and hit enable signal HE are both low, read data on a bus WRB can be output onto bus WRBX.

A control signal CWO output from R/W control circuit 413 can control the operation of I/O buffer 412. According to one embodiment, when control signal CWO is high, I/O buffer 412 can output read data on bus WRBX to I/Os, which may be external to a DRAM device 400. However, when control signal CWO is low, I/O buffer 412 can input external write data on I/Os onto bus WRBX.

A DRAM circuit 400 may further include a row control circuit 414 and a column control circuit 415. In the example of FIG. 13, a row control circuit 414 may receive an ATD signal, a write enable signal /WE, and a refresh control signals REFA and REFB. In response to such inputs, a row control circuit 414 may generate a row enable signal RE, a sense amplifier enable signal SE, a precharge enable signal PE, and a control signal CC. More particularly, a row enable signal RE may be a one-shot pulse that is generated in response to the rising edge of an ATD signal. The width of a row enable signal RE pulse may be set long enough to enable read and write operations.

A row control circuit 414 may also delay a row enable signal RE to generate a sense amplifier enable signal SE. Such control signals may also be generated for refresh operations. When the row control circuit 414 receives a refresh control signal REFB, the row control circuit 414 can generate a row enable signal RE, sense amplifier enable signal SE, and precharge enable signal PE. These signals (RE, SE and PE) may be one-shot type signals, with the sense amplifier enable SE and precharge enable PE signals being delayed with respect to the row enable signal RE. A row control circuit 414 can further generate a control signal CC by delaying a row control signal RE.

A column control circuit 415 may receive a control signal CC and delay the signal to generate a column enable signal CE. A column enable signal CE can be supplied to column decoder 404. In this way a column enable signal CE may also be a one-shot type signal.

It is noted that a row enable signal RE and column enable signal CE may be one-shot pulses that correspond to a pulse word signal, described above in conjunction with a first embodiment.

Having described the construction of a DRAM circuit 400 according to a second embodiment, the operation of such a DRAM circuit 400 will now be described with reference to FIGS. 13 and 14.

Figure 14:
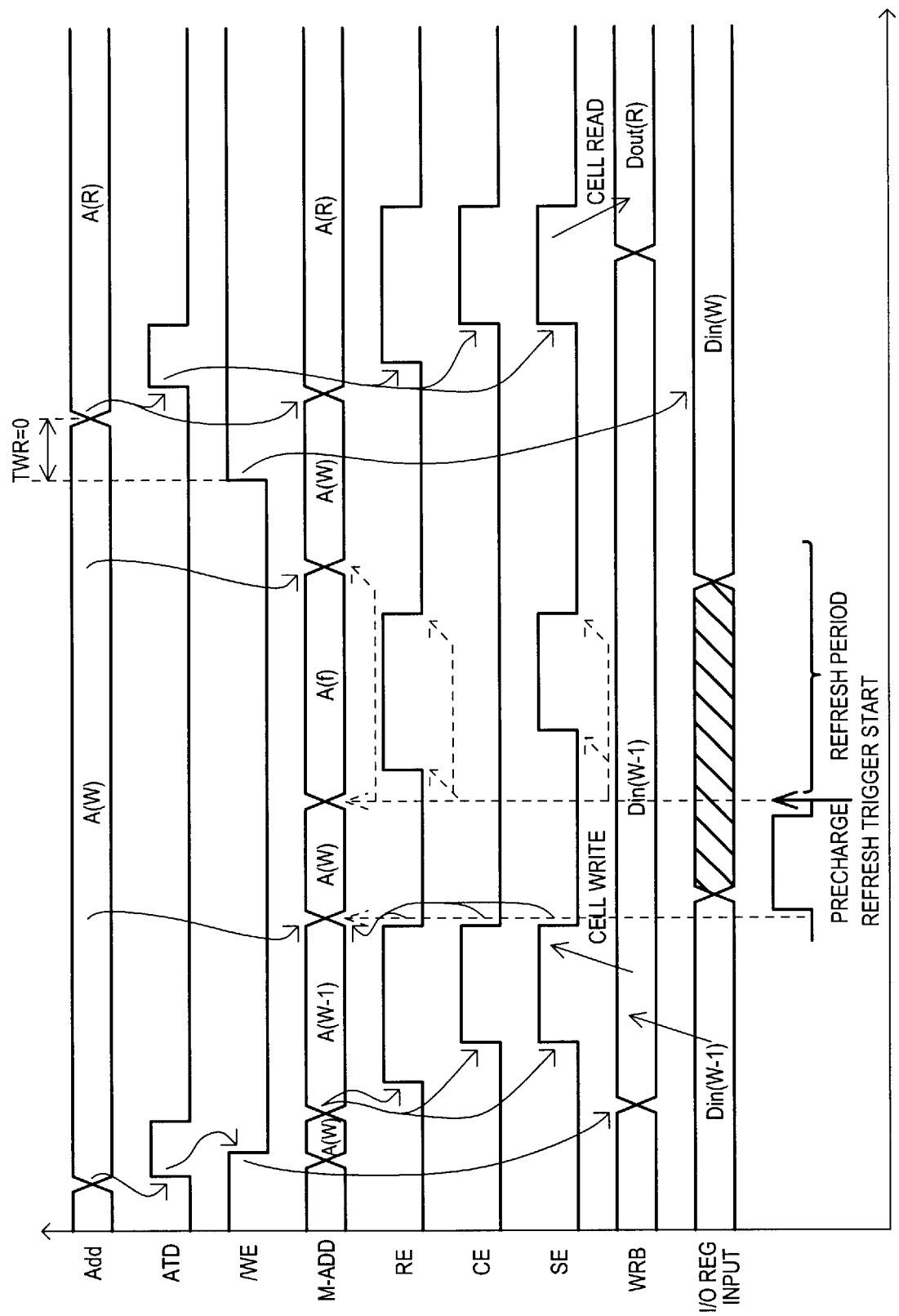
FIG. 14 is a timing diagram showing the operation of the embodiment of FIG. 13.

FIG. 14 is a timing diagram showing various waveforms including an applied address Add, an ATD signal, a write enable signal /WE, an address received by a row decoder M-ADD, a row enable signal RE, a column enable signal CE, a sense amplifier enable signal SE, values on a data bus WRB, and inputs to an I/O register.

In operation, a DRAM circuit 400 may have an address (Add) that switches to a value A(W) at input buffer 405. This address may be buffered and supplied to address register circuit 406 and ATD circuit 408. It is noted that address register circuit 406 may store address A(W−1) within built-in register circuits from a previous cycle. The change in address Add may result in an ATD signal pulsing high. A write enable signal /WE may then transition low. A low /WE signal can activate a control signal LW1. With control signal LW1 active, address register circuit 406 may output address A(W−1) as L-ADD to multiplexer 407.

A high ATD signal can also result in multiplexer 407 outputting received address A(W−1) as address M-ADD. In this way, an address A(W−1) may be applied to row decoder 402.

A low transition in write enable signal /WE may also result in a row control circuit 414 activating a row enable signal RE and sense amplifier enable signal SE. In addition, a control signal CC provided from row control circuit 414 may result in column control circuit 215 outputting column enable signal CE to column decoder 404.

At a data end of a DRAM circuit 400, R/W control circuit 413 may receive the low-going /WE signal transition, and activate control signal LW2. In response to control signal LW2, data register circuit 411 may output previously stored data Din(W−1) that can correspond to previous address A(W−1). In this way, write data Din(W−1) may be placed on bus WRB.

In response to an active row enable signal RE, row decoder 402 may select a word line corresponding to received M-ADD address A(W−1). Subsequently, in response to an active column enable signal CE, a column decoder 404 may select a sense amplifier within sense amplifier reset circuit 403 according to address A(W−1). This may connect the selected sense amplifier to bus WRB. As shown in FIG. 14, write data Din(W−1) may be on bus WRB. In this way data Din(W−1) may be written into one or more memory cells corresponding to address A(W−1).

If reference is made again to FIG. 14, it is noted that the writing of data Din(W−1) can occur at a time address A(W) is applied to a DRAM device 400. Thus, such a write operation may be considered a "late" write operation.

Once a late write operation is complete and the duration of a read enable signal RE pulse has passed, a read enable signal RE, column enable signal CE and sense amplifier enable signal SE may return low. Further a control signal LW1 may also transition low, storing address A(W) in the built-in registers of address register circuit 406, and outputting address A(W) as address L-ADD. Multiplexer 407 may then provide address A(W) as address M-ADD to row decoder 402.

Following a predetermined delay after a transition in address to address A(W), data corresponding to address A(W) may be input from I/O buffer 412 on bus WRBX to data register circuit 411.

Also following a late write operation, a precharge enable signal PE (not shown in FIG. 14) may be activated initiating a precharge operation. A description of a precharge operation, shown in FIG. 13, is omitted in this description.

In the particular example of FIG. 14, a refresh operation follows a precharge operation. In a refresh operation, a refresh control signal REFB can result in row control circuit 414 activating a row enable signal RE, which can be a one-shot signal. After a predetermined delay, a sense amplifier enable signal SE can be generated from a row enable signal RE. Refresh control circuit can generate a refresh address A(f), and supply this address as R-ADD to multiplexer 406.

Because a refresh operation is taking place, a refresh control signal REFB can cause multiplexer 406 to output the refresh address (A(f)) as address R-ADD, instead of stored address L-ADD. This may result in the address M-ADD applied to row decoder 402 being refresh address A(f). With row enable signal RE active, a row of memory cells may be selected corresponding to address A(f). Such memory cells may be refreshed by sense amplifiers within sense amplifier reset circuit 403 according to active sense amplifier enable signal SE. In this way, a refresh operation may be completed.

It is understood that while the above example of a refresh operation may be initiated by a refresh control signal REFB, such a refresh operation may also be initiated by an externally applied refresh control signal. One skilled in the art would recognize that such an external refresh controls signal may be a single external signal or combination of external signals.

In this way, following a late write operation, a DRAM circuit 400 according to one embodiment may perform a precharge operation and/or a refresh operation.

Following a refresh operation, a DRAM circuit 400 may continue with a write operation. When a row enable signal RE and sense amplifier enable signal SE return to a low level at the end of a refresh operation, a refresh control signal REFB may return to an inactive level, and stored address L-ADD may be applied as address M-ADD to row decoder 402. As noted previously, address A(W) was previously stored in address register circuit 406, thus address A(W) may be applied as address M-ADD to row decoder 402.

Also, following a refresh operation, write enable signal /WE may return high. This may result in control signal LW2 from R/W control circuit 413 inputting write data Din(W) to built-in registers.

Referring yet again to FIG. 14, the timing diagram shows an example where a read operation for address A(R) follows a write operation to address A(W). Thus, address Add can transition once again from address A(W) to address A(R). Because a write enable signal /WE remains inactive (high, in this example), address register circuits 406 can output buffered address A(R) as address L-ADD. It is noted that built-in register circuits within address register 406 may continue to store write address A(W).

A change from address A(W) to A(R) may also result in ATD circuit 408 activating an ATD signal. An ATD signal may be received by row control circuit 414, which may then activate row enable signal RE and, after a predetermined delay, sense amplifier enable signal SE. A column control circuit 415 may activate a column enable signal CE. An active row enable signal RE may result in row decoder 402 selecting a row of memory cells corresponding to address A(R). According to sense amplifier enable signal SE, sense amplifiers within sense amplifier reset circuit 403 may amplify data from the selected memory cells. According to column enable signal CE, column decoder 404 may output read data Dout(R) from column decoder 404 onto bus WRB.

It is noted that in the event a read address is the same as a previously applied write address, read data may be provided from data register circuit 411 rather than memory cell array 401. More particularly, if it is assumed that address A(R) is the same as address A(W), address register circuit 406 could activate hit signal HIT. Hit signal HIT along with an ATD signal could be received by hit control circuit 410. Because a hit signal HIT is active, hit control circuit 410 can activate hit enable signal HE. In response to a hit enable signal HE, data register circuit 411 may output previously stored write data Dout(W) as read data Dout(W). In this way, the reading of incorrect data when a read address is the same as that for a late write operation, can be avoided. This may further improve read speeds of a DRAM circuit 400.

As previously noted, in a second embodiment, a row enable signal RE, column enable signal CE, and sense amplifier enable signal SE may be one-shot pulses generated in an equivalent manner to the pulse word signal of previously described embodiments. In particular such signals RE, CE and SE may be activated when a write enable signal /WE is active. A late write operation may be performed according to such signals.

As also noted above and illustrated in the second embodiment, precharge and/or refresh operations may be executed within such a late write operation. This can improve timing margins even when a read operation follows a write operation. Because a precharge and/or refresh operation may occur during a late write operation cycle, a read operation may immediately follow the conclusion of a write cycle. Thus, a timing requirement, shown as TWR in FIG. 14, can be zero according to the present invention. This can further increase speeds, and is in sharp contrast to conventional timing requirements where TWR is greater than zero.

Figure 15:
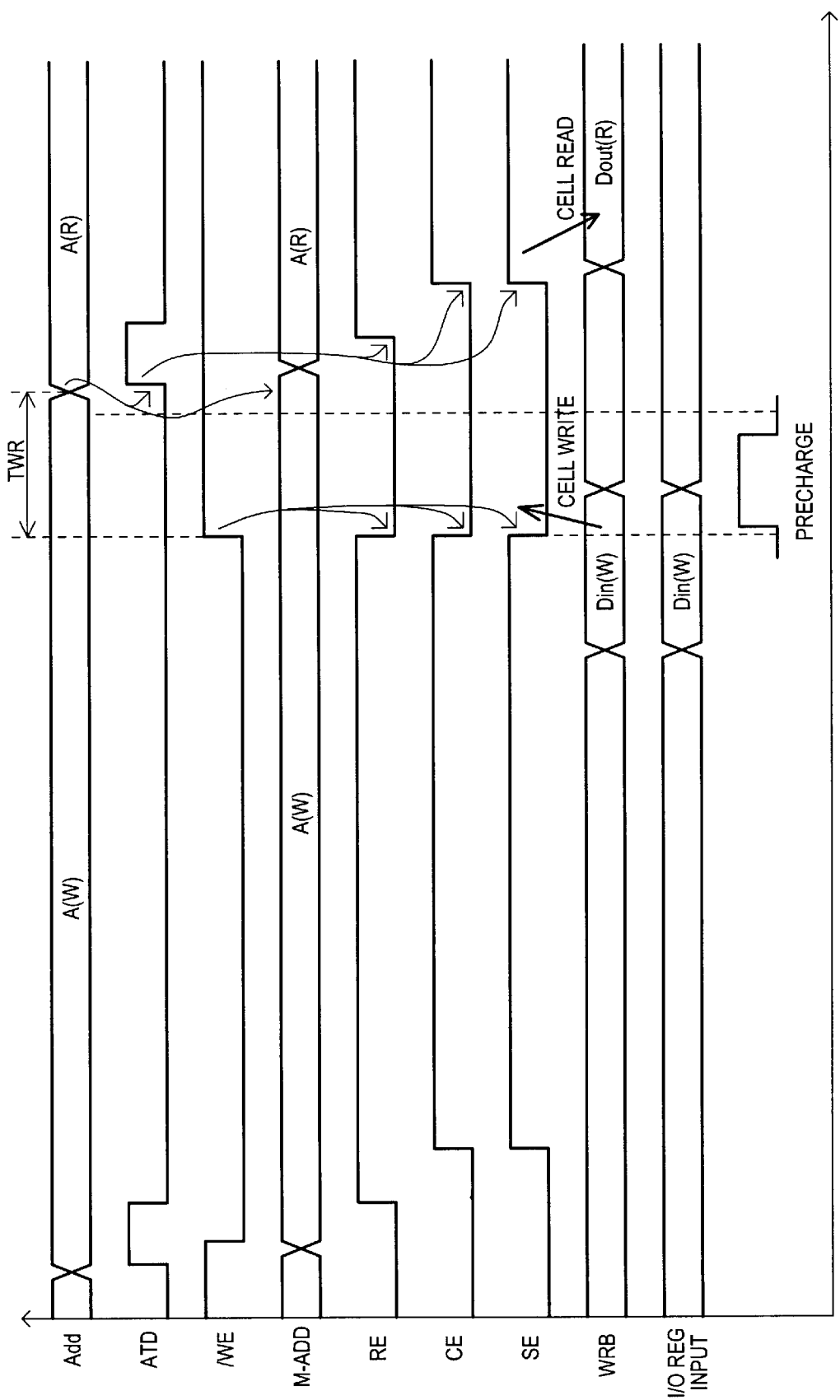
FIG. 15 is a timing diagram showing the operation of a conventional DRAM circuit.

To better understand the particular timing requirement advantages of the second embodiment, a timing chart of a conventional DRAM circuit operation is shown in FIG. 15. FIG. 15 includes waveforms for an address Add, an ATD signal, a write enable signal /WE, an address applied to a row decoder M-ADD, a row enable signal RE that may select a row of memory cells, a column enable signal CE that may select one or more columns of memory cells, a sense amplifier enable signal SE, a bus WRB, and an input of an I/O register.

In the conventional DRAM illustrated by FIG. 15, late write operations are not possible. In FIG. 15, an address Add can transition to address A(W). Such an address may be applied as address M-ADD, as shown. When a write enable signal /WE is activated (transitions low), a row enable signal RE, column enable signal CE and sense amplifier enable signal SE may rise.

Write data may then be applied to a conventional DRAM device. Such write data Din(W) may be applied as an output from I/O registers onto bus WRB.

According to address A(W) and row enable signal RE, a row of memory cells may be selected. According to column enable signal CE and at least a portion of address A(W), one or more columns of memory cells may be selected. Write data Din(W) may be written into a conventional memory cell array and amplified according to sense amplifier enable signal SE. In this way, a conventional write operation may be completed.

As further shown in FIG. 15, to prepare a memory cell array for a subsequent operation, a precharge cycle may follow a write operation. Such a precharge operation can require a minimum amount before a subsequent read operation may take place. Such a time period is shown as TWR in FIG. 15. Still further, if a refresh operation is to take place after a write operation, such a refresh operation may also have to be performed before a subsequent read operation. This may further increase a TWR timing requirement. Thus, the present invention may remove or reduce such a requirement by allowing for a TWR requirement that is smaller or even zero.

As has been described, according to a second embodiment, a DRAM circuit may receive a write address and corresponding write data. Such a write address and data may be stored during the cycle in which the write address and data is provided. In a following write cycle, previously stored write data may be written according to a stored address, thereby executing a delayed write operation. Still further, such a delayed write operation may be performed during a first portion of write cycle, freeing subsequent portions of the write cycle for a precharge and/or refresh operation. In this way a TWR timing requirement may be substantially shortened and/or set to zero. This can increase access speeds for a DRAM device.

Thus, according to the various disclosed embodiments, a semiconductor memory may be an asynchronous device that generates timing signals internally, and not in response to an external synchronous signal. Such a memory device can include a "late" write operation that latches data during one write cycle and then writes the latched data to memory cells in a subsequent write cycle. Such an arrangement can allow the allowable delay between the conclusion of a write operation and start of a read operation (TWR) to substantially shortened, increasing access speeds for read cycles.

In the case of an SRAM circuit, if applied write data undergoes various transitions during a write cycle, only the last write data will be latched. This can prevent unnecessary memory cell selection that can occur in conventional pulse word arrangements. Such unnecessary memory cell selection can result in higher current consumption.

The embodiments further disclose arrangements where write data to a memory device (e.g., a DRAM or SRAM) can be latched in a write operation to a particular address. Then, if a read operation is subsequently performed to the same address, the latched write data can be provided as read data.

The embodiments further disclose SRAM circuits that may include a pulse word system with a memory cell array that includes "true" 4-T memory cells. By controlling timing pulse lengths, data can be written to, and read from, the 4-T memory cells without destroying data in de-selected memory cells, as can be the case in some conventional approaches.

Thus, the various one pulse write operations described may enable an asynchronous SRAM circuit that can include true 4-T type memory cells. Further, such arrangements may enable a DRAM circuit to execute a precharge and/or refresh operation following a one pulse write operation. This may further improve the operating speed of such a DRAM circuit.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
    a plurality of memory cells that can be selected according to an internal pulse signal that is not generated in response to an external periodic timing signal; and
    circuits for storing a write address and write data during one write operation and outputting the stored write address and write data during a subsequent write operation.

2. The semiconductor memory device of claim 1, further including:
    the circuits for storing a write address and write data value include
        an X-address register and Y-address register for latching the write address and generating an X-address signal and Y-address signal, and a data register for storing the write data;

the plurality of memory cells are a plurality of static random access memory (SRAM) cells in a memory cell array having word lines selectable by the X-address signal and the internal pulse signal and digit lines selectable by the Y-address signal;

an internal pulse generator that provides the internal pulse signal in response to transitions in the applied address; and a write enable signal generator that generates a write enable signal for latching address and data values during the one write operation and outputting the stored write address during the subsequent write operation; wherein write data are written into at least one memory cell by a word line and bit line selected by a stored write address.

3. The semiconductor memory device of claim 2, wherein:

the SRAM cells include a pair of driver transistors having gates and drains cross coupled to one another, and a pair of access transistors having gates coupled to one of the word lines and source-drain paths coupled between the drains of the driver transistors and a pair of digit lines.

4. The semiconductor memory device of claim 3, wherein:

the driver transistors comprise n-channel insulated gate field effect transistors (IGFET) and the access transistors comprise p-channel IGFETs.

5. The semiconductor memory device of claim 1, wherein:

the internal pulse signal is a single pulse for each write operation.

6. The semiconductor memory device of claim 1, wherein:

the circuits further compare a stored write address from a write operation with a read address following the write operation, and output write data from the write operation when the stored write address matches the read address.

7. A semiconductor memory device, comprising:

a plurality of SRAM cells arranged into rows, each SRAM cell is a four transistor cell including two driver transistors of a first conductivity type that drive complementary nodes to different potentials and two access transistors of a second conductivity type that couple the complementary nodes to a digit line pair, each row of SRAM cells being selected by a pulse word line signal on a corresponding word line wherein the pulse word line signal is generated in response to an internal pulse signal; and a pulse generator circuit that generates the internal pulse signal that is not generated in response to an external periodic timing signal.

8. A semiconductor memory device, comprising:

a memory cell array of dynamic random access memory (DRAM) cells;

an address register circuit that can store an address of a previous write operation and output the stored address in response to a subsequent write operation;

a data register circuit that can store a write data from the previous write operation; and a write enable signal generator for receiving a write enable signal and generating a row enable signal pulse and column enable signal pulse for writing the write data of the previous write cycle into memory cells corresponding to the write address of the previous cycle.

9. The semiconductor memory device of claim 8, wherein:

the write enables signal generator further generates a precharge enable signal pulse for enabling a precharge operation for the memory cells.

10. The semiconductor memory device of claim 9, wherein:

the write enable signal generator generates a sense amplifier enable signal pulse that follows the row enable signal pulse.

11. The semiconductor memory device of claim 8, wherein:

the row enable signal pulse and column enable signal pulse are single pulses for each write operation.

12. The semiconductor memory device of claim 8, wherein:

the address register compares a stored write address from a write operation with a read address following the write operation, and activates a hit signal when the stored write address matches the read address; and the data register circuit outputs write data from the write operation when the hit signal is activated.

13. The semiconductor memory device of claim 8, wherein:

the write enable signal generator comprises an address transition detect (ATD) circuit that activates an ATD signal pulse when an applied address changes from one value to another value.

14. The semiconductor memory device of claim 13, further including:

a row decoder for selecting at least one row of memory cells in response to the row enable signal pulse; and the write enable signal generator further includes a row control circuit that generates the row enable signal pulse by delaying at least a first edge of the ATD signal pulse.

15. The semiconductor memory device of claim 13, further including:

a sense amplifier circuit that amplifies data values for at least a portion of a memory cell row in response to a sense amplifier enable signal pulse; and the write enable signal generator further includes a row control circuit for generating the sense amplifier enable signal pulse by delaying at least the first edge of the ATD signal pulse.

16. The semiconductor memory device of claim 13, further including:

a column decoder for selecting at least one column of memory cells in response to the column enable signal pulse; and the write enable signal generator further includes a column control circuit that generates the column enable signal pulse by delaying at least a first edge of the ATD signal pulse.

17. The semiconductor memory device of claim 8, further including:

a refresh control circuit that generates a refresh control signal pulse during a refresh operation; and the write enable signal generator further includes row enable circuit that generates the row enable signal pulse in response to the refresh control signal pulse.

18. The semiconductor memory device of claim 17, further including:
   the refresh control circuit generates a refresh address in a refresh operation; and
   a multiplexer that receives an output address from the address register circuit and the refresh address from the refresh control circuit and provides the refresh address as an output in response to the refresh control signal pulse.

19. The semiconductor memory device of claim 8, further including:
   a read/write control circuit that generates an address register control signal pulse in response to the activation of the write enable signal; and
   the address register circuit outputs the address of a previous write cycle when the address register control signal pulse is active and outputs a currently applied address value when the address register control signal pulse is inactive.

20. The semiconductor memory device of claim 8, further including:
   the address register circuit activates a hit enable signal when a read address of a read operation is the same as a write address of a previous write operation; and
   the data register circuit outputs the write data of the previous write operation when the hit enable signal is activated.

\* \* \* \* \*